United States Patent [19]

Sugimoto

[11] 4,422,042
[45] Dec. 20, 1983

[54] NUCLEAR RESONANCE APPARATUS INCLUDING MEANS FOR ROTATING A MAGNETIC FIELD

[75] Inventor: Hiroshi Sugimoto, Ootawara, Japan

[73] Assignee: Tokyo Shibaura Denki Kabushiki Kaisha, Kawasaki, Japan

[21] Appl. No.: 265,240

[22] Filed: May 19, 1981

[30] Foreign Application Priority Data

Jun. 13, 1980 [JP] Japan .................................. 55-79391

[51] Int. Cl.³ .......................................... G01R 33/08
[52] U.S. Cl. .................................. 324/313; 324/309; 324/319
[58] Field of Search ............... 324/300, 309, 319, 320, 324/313

[56] References Cited

U.S. PATENT DOCUMENTS

| | | | |
|---|---|---|---|
| 3,418,538 | 12/1968 | Roman ................................. | 324/319 |
| 3,714,553 | 1/1973 | Keller ................................. | 324/319 |
| 3,789,832 | 2/1974 | Damadian ........................... | 128/2 R |
| 4,284,950 | 8/1981 | Burl et al. .......................... | 324/320 |
| 4,333,053 | 6/1982 | Harrison ............................. | 324/309 |
| 4,354,499 | 10/1982 | Damadian ........................... | 324/309 |

OTHER PUBLICATIONS

P. C. Lauterbar, "Image Formation by Induced Local Interactions: Examples Employing Nuclear Magnetic Resonance" Nature vol. 242, Mar. 16, 1974, pp. 190-191.

Crooks et al., "Tomographic Imaging with Nuclear Magnetic Resonance", Investigative radiology, Jan.-Feb. 1978, pp. 63-66.

Primary Examiner—Michael J. Tokar
Attorney, Agent, or Firm—Finnegan, Henderson, Farabow, Garrett & Dunner

[57] ABSTRACT

A nuclear magnetic resonance apparatus including magnet apparatus for generating a homogeneous static magnetic field between its magnetic poles, shims of a magnetic substance mounted on the magnetic poles to apply a first gradient magnetic field intensity distribution in a direction orthogonal as to the direction of line of magnetic force of the static magnetic field, gradient magnetic field generating electromagnetic apparatus for generating a second gradient magnetic field having a gradient magnetic field intensity distribution in superimposition with the static magnetic field and for changing the magnetic field gradient of the first gradient magnetic field, an oscillator for generating an oscillating output having a frequency corresponding to the nuclear magnetic resonance condition of an atomic nucleus to be measured, a coil wound around a body to be examined for applying the output of said oscillator as electromagnetic waves upon the body, a receiver for detecting the nuclear magnetic resonance signals received by the coil, a gradient magnetic field controller making a magnetic field line equivalent to the combined gradient magnetic fields and for rotating the line along the section of the body to be examined by controlling said gradient magnetic field generating electromagnetic apparatus and devices for recording the nuclear magnetic resonance signals, for reconstructing the concentration distribution of the specific atomic nuclei in the section of the body, and a display unit for depicting the result of reconstruction.

5 Claims, 12 Drawing Figures

४,४२२,०४२

NUCLEAR RESONANCE APPARATUS INCLUDING MEANS FOR ROTATING A MAGNETIC FIELD

BACKGROUND OF INVENTION

This invention relates to a nuclear magnetic resonance apparatus for measuring the concentration distribution of a specific atomic nucleus in a body to be examined and/or the relaxation time of the same from the outside of the body by making use of the nuclear magnetic resonance (NMR) phenomena.

The construction adjacent the magnetic field generating part of a recently developed examining NMR apparatus is shown in FIG. 1. (See application filed concurrently herewith under the title "Nuclear Magnetic Resonance Apparatus Utilizing Multiple Magnetic Fields".) As shown, a homogeneous static magnetic field is generated by a pair of electromagnets 1 in the space between their pole plates 2. The direction of that magnetic field is designated by the arrow Z. Also, a gradient magnetic field is superimposed in the direction Z by a pair of electromagnets 3. The resulting magnetic fields are shown in FIG. 2.

In FIG. 2, the axis of abscissas designates the position of the magnetic field in the direction Z and the axis of ordinates designates the intensity of the magnetic field at each position. Although the intensity of the magnetic field is constant regardless of its position in the direction Z if there is only the homogeneous magnetic field, as shown by a broken line H1, the total field changes in accordance with the positions in the direction Z if the gradient magnetic field shown by a phantom line H2 is added to the homogeneous magnetic field, as shown by the solid line H3, so that a gradient intensity distribution of the total magnetic field may be obtained in the direction Z.

For example, when measurements are performed by using a phantom (or a model of a body to be examined) 4, a part 4a of which has a preassigned low concentration of hydrogen nuclei, for example, the intensity of a nuclear magnetic resonance signal is obtained with the result shown in FIG. 3(a), having a deflection 4a, in the intensity of the magnetic field. Since the intensity of the magnetic field, as shown by the resonance signals, and the position of the field in the direction Z are in a corresponding relation, as shown in FIGS. 1, 2 and 3, the intensity of the NMR signal obtained represents the projection datum in the direction perpendicular to the direction Z in the particular section of the phantom. Therefore, if projection data in each direction are obtained, the concentration distribution image of a specific atomic nucleus (for example, hydrogen nucleus) in the section can be reconstructed in the same manner as in the case of computed tomography (CT).

For realizing this result, the apparatus of FIG. 1 has been able to obtain such data only while rotating the body, such as the phantom 4, within the magnet frame. For example, the signal shown in FIG. 3 (b) is obtained when the phantom 4 has been rotated 90 degrees. In FIG. 1, a coil 5 wound around the phantom 4 is used for detecting the nuclear magnetic resonance signal after adding a high-frequency electromagnetic pulse train to the body.

As described above, since the examining NMR apparatus in FIG. 1 applies a gradient magnetic field in only one direction, the following means have been needed for obtaining projection data as to a section of the body:

(a) to obtain the signal while rotating the body within the magnetic frame; or (b) to obtain the signal while rotating the magnet frame around the body.

A rotating scan apparatus is obviously needed for obtaining the result by either means. In either case, the scan is time-consuming. Additionally, it is feared that the rotation of the body may involve movement of portions of the body, or interaction of parts of the body, which may be damaging to an already unhealthy body. The magnet frame involves considerable weight, and the rotation of the frame is burdensome and difficult.

SUMMARY OF THE INVENTION

It is accordingly an object of this invention to provide an NMR apparatus which can measure either the concentration distribution of specific atomic nuclei in a szction of a body or the difference in their relaxation times without mechanical rotation of the body or the magnetic field generating apparatus.

Briefly, this and other objects are achieved in accordance with the invention by constructing a nuclear magnetic resonance apparatus for measuring the nuclear magnetic resonance of a specified atomic nucleus in a body, the apparatus comprising a magnetic apparatus for generating a homogeneous static magnetic field between its magnetic poles, shims composed of a magnetic substance mounted on the magnetic poles for applying a first gradient magnetic field intensity distribution in a direction orthogonal as to the direction of line of magnetic force of the static magnetic field, gradient magnetic field generating electromagnetic apparatus for generating a second gradient magnetic field having a gradient magnetic field intensity distribution as to the direction along the line of magnetic force in superimposition with the static magnetic field for varying the magnetic field gradient of the first gradient magnetic field, an oscillator for generating an oscillating output having a frequency corresponding to the nuclear magnetic resonance condition of the atomic nucleus to be measured, a coil wound around the body to be examined for applying the output of said oscillator as electromagnetic waves upon the body and for receiving nuclear magnetic resonance signals from the nuclei, a receiver for detecting the nuclear magnetic resonance signals received by the coil, a gradient magnetic field controller producing a magnetic field line equivalent to the gradient magnetic field defined as the combination of the first gradient magnetic field generated by the magnetic apparatus, as acted on by the shims, and the second gradient magnetic field generated by the electromagnetic apparatus, rotated along the section of the body to be examined by controlling the electromagnetic apparatus, a recorder for recording the nuclear magnetic resonance signal intensity detected by the receiver as to a plurality of directions of equivalent magnetic fields due to said gradient magnetic field controller in a manner to correspond to the position as to the direction perpendicular to said equivalent magnetic field line, a reconstructor for reconstructing the concentration distribution of the specific atomic nuclei in the section of the body on the basis of the nuclear magnetic resonance signal intensity as to a plurality of directions recorded in the recorder, and a display unit for depicting the result of the reconstruction by the reconstructor.

DESCRIPTION OF THE PREFERRED EMBODIMENT

The preferred embodiment of this invention will now be described by reference to the drawings.

Figure 1:
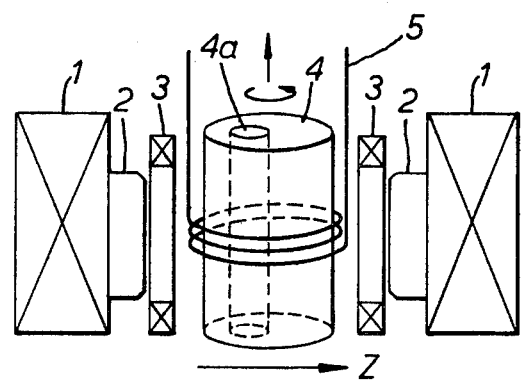
FIG. 1 is a digrammatical illustration for explaining the construction of a nuclear resonance apparatus, utilizing fixed direction magnetic fields.
Figure 2:
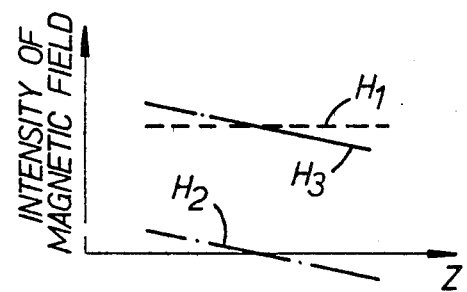
FIGS. 2, 3(a) and 3(b) are graphs for explaining the operation of the apparatus of FIG. 1.
Figure 3:
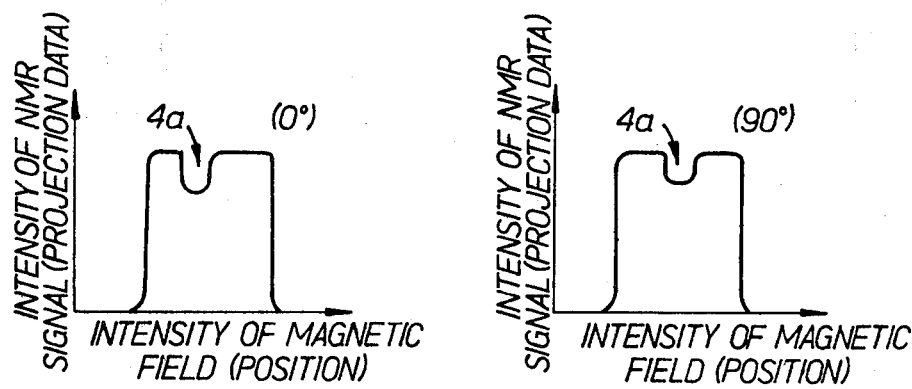
Figure 4:
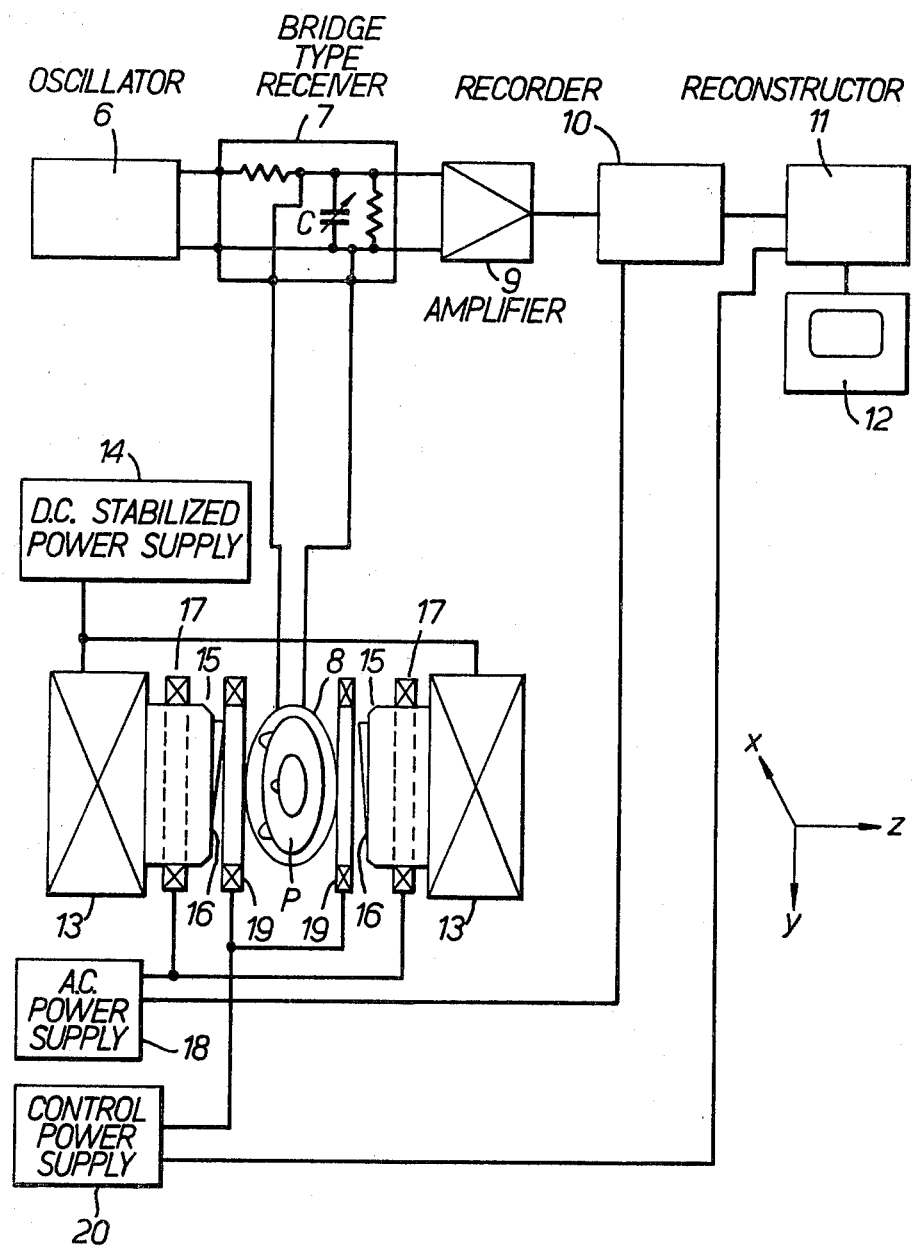
FIG. 4 is a schematic block diagram to illustrate one embodiment of this invention.

In FIG. 4, an oscillator 6 generates high-frequency waves with selectably variable intensity (or amplitude) and a bridge type receiver 7 for detecting an NMR signal from a body P to be examined by making use of the output of the oscillator 6. A coil 8 wound around the body P applies the high-frequency waves (or electromagnetic waves) from the oscillator 6 to the body P through the receiver 7 and extracts the NMR signal from the body P to apply it to the receiver 7. An amplifier 9 amplifies the NMR signal generated from the receiver 7 and a recorder 10 records the NMR signal amplified by the amplifier 9. A reconstructor 11 reconstructs the concentration distribution image of the specific atomic nuclei on the basis of the NMR signal recorded in the recorder 10 and a display unit 12 depicts the image reconstructed by the reconstructor 11.

Magnetic apparatus, such as a pair of electromagnets 13, generates a homogeneous static magnetic field between the magnetic pole plates 15 of the electromagnets and a D.C. stabilized power supply 14 energizes the electromagnets. Wedge-shaped shims 16 of a magnetic substance are disposed to protrude from the facing magnetic pole plates 15 for generating a first gradient magnetic field. A.C. electromagnetic apparatus such as electromagnetic coils 17 make an A.C. magnetic field generated in superimposition with the static magnetic field and an A.C. power supply 18 energizes the electromagnetic coils 17.

Electromagnetic apparatus, such as a pair of coils 19, generate a second gradient magnetic field in superimposition with the static magnetic field. A gradient magnetic field controller, such as control power supply 20, actuates the coils 19 to control the rotation of the total gradient magnetic field.

Figure 5:
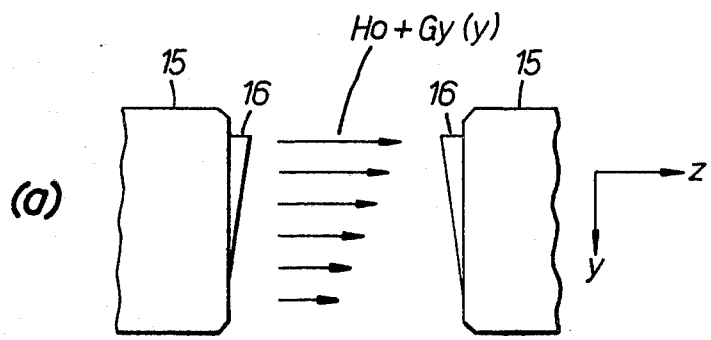
FIGS. 5(a), 5(b), 6(a), 6(b), 7, 8(a) and 8(b) are diagrammatical illustrations for explaining the operation of the apparatus of FIG. 4.
Figure 5:
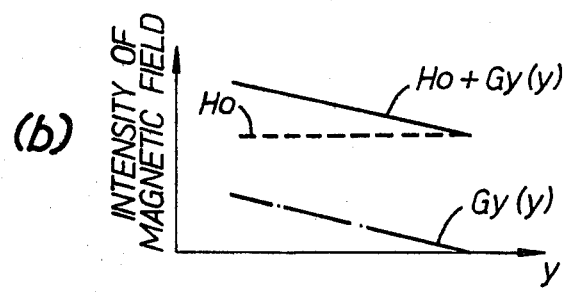

In operation, homogeneous static magnetic field Ho (FIG. 5) in the direction Z is generated by flowing D.C. current from the stabilized power supply 14 to the electromagnets 13. Since the wedge-shaped shims 16 are mounted on the magnetic pole members 15, the homogeneous static magnetic field Ho is varied to make a first gradient magnetic field in the direction Y in FIG. 4. Thus, the gradient magnetic field Gy (y) is generated, as shown in FIGS. 5(a) and (b). A gradient is, thus, added to the static magnetic field Ho by the first gradient magnetic field Gy (y) due to the shims 16 to produce a magnetic field having a line of magnetic force in the direcon Z and a gradient intensity distribution of the magnetic field in the direction Y.

Figure 6:
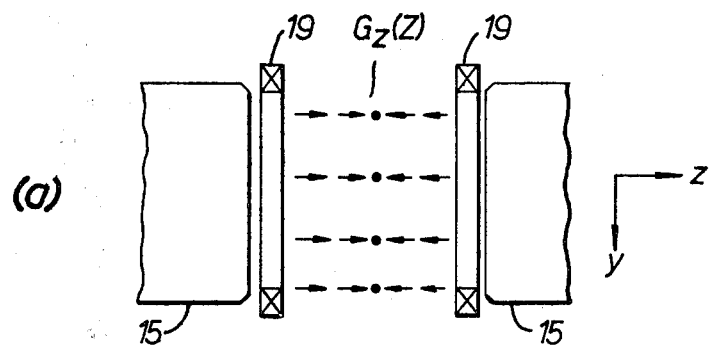
Figure 6:
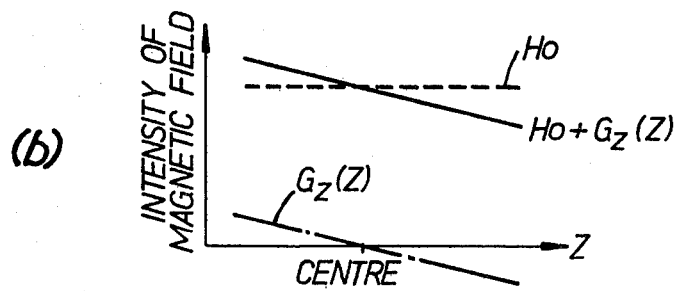

In addition, as shown in FIG. 6(a), the second gradient magnetic field Gz (z) having a gradient intensity distribution of magnetic field in the direction Z, is generated by flowing A.C. current to the pair of coils 19 by the control power supply 20, the current flow in the pair of coils being in opposite directions.

Figure 7:
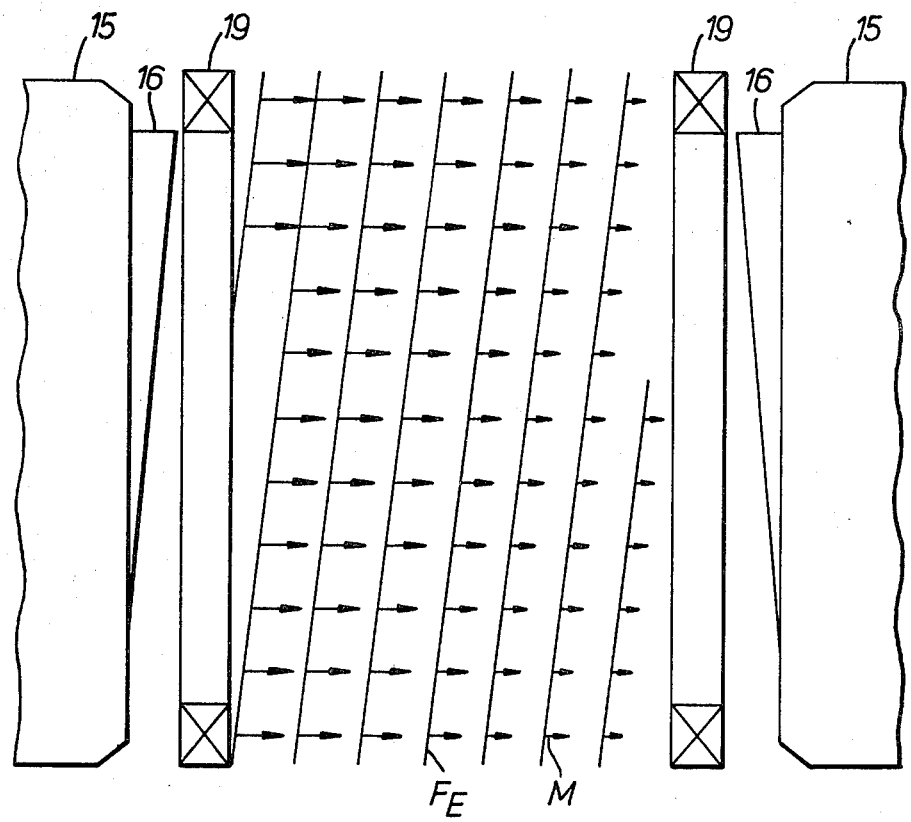

The intensity distribution of the magnetic field in the case of superimposing the second gradient magnetic field Gz (z) on the static magnetic field Ho is shown in FIG. 6(b). The gradient magnetic field Gz (z) has the feature that the line of magnetic force is in the direction Z, the intensity of the magnetic field is zero at the center and the directions of the lines of magnetic force are reversed at the sides of the center. When the reversed gradient magnetic fields are used together, the magnetic field superimposed on the static magnetic field results in a composite gradient magnetic field having a line of magnetic force M oriented in the direction Z and a gradient intensity of magnetic field oriented in a specific direction on the y-z face, as shown in FIG. 7. Namely, the intensity of magnetic field H (y,z) at a point (y,z) in the y-z coordinates is given for the static magnetic field Ho and the gradient magnetic fields Gy and Gz by the following equation:

$$H(y,z) = Ho + Gy(y) + Gz(z) \tag{1}$$

And the gradient magnetic fields Gy (y) and Gz (z) are given in a linear scope by the following equations:

$$Gy(y) = Gyo \cdot Y \tag{2}$$

$$Gz(z) = Gzo \cdot Z$$

Assuming that the center point in the Z axis (FIG. 6b) is at the center between the magnetic pole plates and the fields on the sides of the center are equal, the intensity of magnetic field H (y,z) is given by the following equation:

$$H(y,z) = Ho + Gyo \cdot Yy + Gzo \cdot Z \tag{3}$$

Here, since the equivalent portions of magnetic field are ones that the sum of the second member and third member of the equation (3) is equal, the following equation is given:

$$Gyo \cdot Y + Gzo \cdot Z = C(\text{constant}) \tag{4}$$

The following equation is derived from the equation (4):

$$y = -\frac{Gzo}{Gyo} \cdot z + \frac{C}{Gyo} \tag{5}$$

namely, a straight line which has the gradient of $-(Gzo/Gyo.)$

Since the value of Gzo can be changed by controlling the output current from the control power supply 20 for the gradient magnetic field generating coils 19, the gradient of the equivalent magnetic field line (or face) $F_E$ (FIG. 7) can be changed. Also, the whole magnetic field can be changed in alternating by the A.C. electromagnetic coils 17 and the A.C. power supply 18.

On the other hand, high-frequency waves, having a constant frequency, are generated from the oscillator 6 for application to the body P through the bridge-type receiver 7 and coil 8. A variable condenser C in the receiver 7 has been previously adjusted so that the output signal from the receiver 7 may be zero when there is no NMR signal. Thus, when an A.C. magnetic field is applied by the electromagnetic coils 17 while the aforementioned gradient magnetic fields are maintained, the integral values of the specific atomic nuclei in each equivalent magnetic field line in a section determined by the coil 8 are sequentially obtained in accordance with the period of the A.C. magnetic field. That is, projection data of the specific atomic nuclei distribution in a direction along equivalent magnetic field lines as to the section under examination are obtained.

After amplifying the projection data with the amplifier 9, they are recorded with the recorder 10. In recording the projection data, synchronizing signals are obtained from the A.C. power supply 18 for the electromagnetic coils 17 so that the record of the projection data may be correlated with the projection position. When the signal-noise ratio (S/N) of the obtained signals is not sufficient, the signals for several periods of the A.C. magnetic field may be integrated.

After obtaining the projection data as to one direction, as described before, the projection data are sent to the reconstructor 11 from the recorder 10, together with the signals correlating the gradient of the equivalent magnetic field lines, which are applied from the control power supply 20 for the gradient magnetic field generating coil 19. Next, the equivalent magnetic field lines are rotated a certain angle by the control power supply 20 to collect again the projection data in the same process as previously described. Thus, an image reconstruction is performed by the reconstructor 11 on the basis of the projection data obtained from a plurality of directions. This reconstruction can be performed with an algorithm similar to that used in the reconstruction in an x-ray computed tomography. The result is depicted on the display unit 12. Consequentially, the concentration distribution image of the specific atomic nuclei can be determined in the section of the body P under examination.

It is known that the difference in the relaxation time $T_1$ of the above-mentioned specific atomic nucleus carries information as to the biochemical situation of human tissue, for example, the difference between normal tissue and malignant tissue. Accordingly, in the above-mentioned construction, the differences in relaxation time can be identified by changing the output signal of the oscillator 6.

Figure 8:
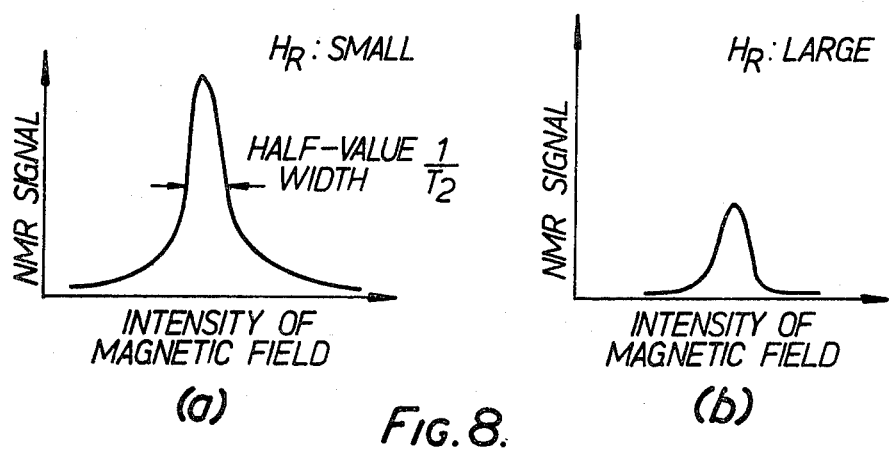

The absorbing term v out of the regular solution of Bloch's equation is given by the following equation:

$$V \alpha \frac{-\gamma H_r}{1/T_2 + \gamma^2 (H_o - H_1)^2 T_2 + \gamma^2 H_r^2 T_1} \quad (6)$$

wherein:
 $\gamma$: gyromagnetic ratio;
 $H_o$: intensity of static magnetic field;
 $H_r$: intensity of rotative magnetic field (which is in proportion to the output signal of the oscillator 6);
 $T_1$: spin-lattice relaxation time; and
 $T_2$: spin-spin relaxation time When the output intensity of the oscillator 6 is small, the Lorentian absorption line having the half-value width of $1/T_2$ is obtained as the projection signal as to a point image as shown in FIG. 8(a). On the other hand, the third term $\gamma^2 H_r^2 T_1$ of the denominator in the equation (6) gradually increases in the portion having a large $T_1$ as the output signal of the oscillator 6 increases so that the absorbing line descends from a peak, as shown in FIG. 8(b), as a result of the resonance saturation. That is, since the amplitude of the NMR signal from the atomic nucleus having a long relaxation time $T_1$ descends as the output of the oscillator 6 increases, the differences of the relaxation time can be judged by comparing the reconstructed images which are obtained on the basis of different output signals $H_r$ of the oscillator 6.

Moreover, a pair of permanent magnets may be utilized as a substitute for the pair of electromagnets in the magnetic apparatus generating the homogeneous static magnetic field. Also, the shims generating the gradient magnetic field may be defined in shapes other than a wedge.

Thus, the concentration distribution image of a specific atomic nucleus in the section of the body can be obtained by a combination of the gradient magnetic field due to the shims and the gradient magnetic field due to the electromagnets without rotating the body of the magnet system. The information as to the differences of the relaxation times of the atomic nuclei can be also obtained easily.

This invention should not be limited only to the embodiment thus far described with reference to the accompanying drawings but can be variously modified and practiced within such a range as is free from changing the gist thereof.

For example, although the above-mentioned embodiment is constructed to perform the measurement of NMR by utilizing the so-called continuous wave method, the so-called pulse method may be utilized as follows:

Pulsating high-frequency waves are generated in place of the steady (or continuous) high-frequency waves from the oscillator 6 so that pulsating electromagnetic waves are applied to the body P through the coil 8. If, at this time, the width $t_p$ of the pulses is defined by the following equation (giving the so-called "90 degree pulses"):

$$\gamma H_1 t_p = \pi/2 \quad (7)$$

the so-called free induction decay signal (FID signal), which is induced in the coil 8 after the irradiation with the pulses, i.e., the Fourier transformation signal of the NMR signal as to each frequency component. So that, if the FID signal is received by the receiver 7 and amplified with the amplifier 9 while generating the above-mentioned gradient magnetic field, the Fourier transformed signal of the projection data is obtained. In this case, since the distribution data are directly obtained, there is no need for the position scan. Therefore, the A.C. magnetic field generating electromagnetic coils 17 and the A.C. power supply 18, shown in FIG. 4, are not needed. In the case of image reconstruction, since the projection data are once subjected to the Fourier transformation in a general algorithm of reconstruction, data processing in the reconstructor 11 is easily performed. According to the pulse method, the signal-noise ratio (S/N) is better than the continuous wave method when the two methods are compared in the same measuring time.

What is claimed is:

1. A nuclear magnetic resonance apparatus for measuring the nuclear magnetic resonance of a specified atomic nucleus in a body, the apparatus comprising:
 a magnet apparatus for generating a homogeneous static magnetic field between its magnetic poles;

shim means composes of a magnetic substance mounted on said magnetic poles for applying a first gradient magnetic field intensity distribution in a direction orthogonal to the direction of the line of magnetic force of the static magnetic field;

gradient magnetic field generating electromagnetic apparatus for generating a second gradient magnetic field having a gradient magnetic field intensity distribution as to the direction along said line of magnetic force in superimposition with the static magnetic field for varying the magnetic field gradient of said first gradient magnetic field;

an oscillator for generating an oscillating output having a frequency corresponding to the nuclear magnetic resonance condition of the atomic nucleus to be measured;

a coil wound around the body to be examined for applying the output of said oscillator as electromagnetic waves upon the body;

a receiver for detecting the nuclear magnetic resonance signal received by the coil;

a gradient magnetic field controller making a magnetic field line equivalent to the gradient magnetic field defined as the combination of the first gradient magnetic field generated by said magnet apparatus, as acted on by said shims, and the second gradient magnetic field generated by said electromagnetic apparatus, and for rotating the line along the section of the body to be examined by controlling said electromagnetic apparatus;

a recorder for recording the nuclear magnetic resonance signal intensity detected by the receiver as to a plurality of directions of equivalent magnetic fields due to said gradient magnetic field controller in a manner to correspond to the position as to the direction perpendicular to said equivalent magnetic field line;

a reconstructor for reconstructing the concentration distribution of the specific atomic nuclei in the section of the body on the basis of the nuclear magnetic resonance signal intensity as to a plurality of directions recorded in the recorder; and a display unit for depicting the result of the reconstruction by said reconstructor.

2. The nuclear magnetic resonance apparatus of claim 1 wherein said gradient magnetic field electromagnetic apparatus includes an A.C. electromagnet apparatus generating an A.C. magnetic field in superimposition with the static magnetic field and wherein said controller issues signals to said recorder correlating data to correspond to the phase of said A.C. magnetic field.

3. The nuclear magnetic resonance apparatus of claim 1 wherein the magnet apparatus generating the homogeneous static magnetic field includes electromagnetic apparatus driven by a D.C. stabilized power supply.

4. The nuclear magnetic resonance apparatus of any one of claims 1, 2 or 3 wherein the amplitude of the oscillating output of the oscillator is selectably variable so that the difference of the relaxation time of the specific atomic nuclei in the section of the body may be measured.

5. The nuclear magnetic resonance apparatus of claim 1 wherein said oscillator includes means for generating pulsating high-frequency waves for use in obtaining free induction decay signals and wherein the reconstructor has means for reconstructing the concentration distribution of the specific atomic nuclei in the section of the body on the basis of said free induction decay signals.

* * * * *